(12) United States Patent
New et al.

(10) Patent No.: US 6,362,648 B1
(45) Date of Patent: *Mar. 26, 2002

(54) MULTIPLEXER FOR IMPLEMENTING LOGIC FUNCTIONS IN A PROGRAMMABLE LOGIC DEVICE

(75) Inventors: Bernard J. New, Los Gatos; Steven P. Young, San Jose; Shekhar Bapat, Santa Clara; Kamal Chaudhary; Trevor J. Bauer, both of San Jose; Roman Iwanczuk, Truckee, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/712,038

(22) Filed: Nov. 13, 2000

Related U.S. Application Data

(60) Division of application No. 09/374,470, filed on Aug. 13, 1999, now Pat. No. 6,201,410, which is a continuation-in-part of application No. 09/283,472, filed on Apr. 1, 1999, now Pat. No. 6,051,992, which is a division of application No. 08/835,088, filed on Apr. 4, 1997, now Pat. No. 5,920, 202, which is a continuation-in-part of application No. 08/806,997, filed on Feb. 26, 1997, now Pat. No. 5,914,616.

(51) Int. Cl.[7] .......................... G06F 7/38; H03K 19/177
(52) U.S. Cl. ............................... 326/40; 326/41; 326/46
(58) Field of Search .............................. 326/39, 40, 41, 326/46, 47, 105

(56) References Cited

U.S. PATENT DOCUMENTS 5,481,206 A * 1/1996 New et al. ..................... 326/38
5,914,616 A    6/1999 Young et al.
5,920,202 A    7/1999 Young et al.
6,051,992 A    4/2000 Young et al.
6,154,052 A * 11/2000 New ........................... 326/41

OTHER PUBLICATIONS

"The Programmable Logic Data Book", Sep. 1996; available from Xilinx, Inc., 2100 Logic Drive, San Jose, CA 95124; pp. 4–11 to 4–23 and 4–294 to 4–295.

* cited by examiner

*Primary Examiner*—Michael Tokar
*Assistant Examiner*—Daniel D. Chang
(74) *Attorney, Agent, or Firm*—Lois D. Cartier; Jeanette S. Harms

(57) ABSTRACT

The invention allows the implementation of common wide logic functions using only two function generators of a field programmable gate array. One embodiment of the invention provides a structure for implementing a wide AND-gate in an FPGA configurable logic element (CLE) or portion thereof that includes no more than two function generators. First and second function generators are configured as AND-gates, the output signals (first and second AND signals) being combined in a 2-to-1 multiplexer controlled by the first AND signal, "0" selecting the first AND signal and "1" selecting the second AND signal. Therefore, a wide AND-gate is provided having a number of input signals equal to the total number of input signals for the two function generators. In another embodiment, a wide OR-gate is provided by configuring the function generators as OR-gates and controlling the multiplexer using the second OR signal.

35 Claims, 6 Drawing Sheets

MULTIPLEXER FOR IMPLEMENTING LOGIC FUNCTIONS IN A PROGRAMMABLE LOGIC DEVICE

CROSS-REFERENCE TO RELATED APPLICATIONS

This application is a divisional application of commonly assigned, U.S. patent application Ser. No. 09/374,470, invented by Bernard J. New et al., entitled "WIDE LOGIC GATE IMPLEMENTED IN AN FPGA CONFIGURABLE LOGIC ELEMENT" and filed Aug. 13, 1999; U.S. Pat. No. 6,201,410, which is a continuation-in-part Ser. No. 09/283,472 application of U.S. Pat. No. 6,051,992, filed Apr. 1, 1999 and inventd by Steven P. Young et al., entitled "CONFIGURABLE LOGIC ELEMENT WITH ABILITY TO EVALUATE FIVE AND SIX INPUT FUNCTIONS";

which is a divisional Ser. No. 08/835,088 application of U.S. Pat. No. 5,920,202, filed Apr. 4, 1997 and invented by Steven P. Young et al., entitled "CONFIGURABLE LOGIC ELEMENT WITH ABILITY TO EVALUATE FIVE AND SIX INPUT FUNCTIONS";

which is a continuation-in-part of Ser. No. 08/806,997 U.S. Pat. No. 5,914,616, filed Feb. 26, 1997 and invented by Steven P. Young et al., entitled "FPGA REPEATABLE INTERCONNECT STRUCTURE WITH HIERARCHICAL INTERCONNECT LINES", all of which are incorporated herein by reference.

FIELD OF THE INVENTION

The invention relates to programmable integrated circuit devices, more particularly to wide logic gates implemented in a single configurable logic element in a field programmable logic device.

BACKGROUND OF THE INVENTION

Field Programmable Gate Arrays (FPGAS) typically include an array of tiles. Each tile includes a Configurable Logic Element (CLE) connectable to CLEs in other tiles through programmable interconnect lines. The interconnect lines typically provide for connecting each CLE to each other CLE. Interconnect delays on signals using these interconnect lines, even between adjacent CLEs, are typically much larger than delays on signals that remain within a single CLE. Therefore, it is desirable to implement a logic function in a single CLE whenever possible, rather than spreading out the logic into two or more CLEs.

CLEs typically include combinatorial function generators, which are often implemented as 4-input lookup tables. Some CLEs can also implement any 5-input function, and some wider functions, by selecting between the output signals of two 4-input function generators with another CLE input signal. One such CLE, implemented in the Xilinx XC4000™-Series FPGAs, is described in pages 4–11 through 4–23 of the Xilinx Sep. 1996 Data Book entitled "The Programmable Logic Data Book", available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.) A portion of an XC4000-Series CLE that can implement any 5-input function is shown in FIG. 1. The output signals F' and G' of the two function generators F and G can be optionally combined with a third input signal H1 in a third function generator 3H to form output signal 3H'. (In the present specification, the same reference characters are used to refer to terminals, signal lines, and their corresponding signals.) The 3H function generator can implement any function of the three input signals (256 functions), including a 2-to-1 multiplexer that can be used when a 5-input function is desired. When function generators F and G share the same four input signals (F1/G1, F2/G2, F3/G3, F4/G4) and function generator 3H is programmed to function as a 2-to-1 multiplexer, output signal 3H' can represent any function of up to five input signals (F1/G1, F2/G2, F3/G3, F4/G4, H1). When the input signals driving function generators F and G are independent, output signal 3H' can represent some functions of up to nine input signals (F1, F2, F3, F4, G1, G2, G3, G4, H1).

For example, to implement a wide AND-gate in an XC4000-Series FPGA, all the function generators F, G, 3H can be configured as AND-gates, as shown in FIG. 2A. Function generators F, G are configured as two 4-input AND-gates, while function generator 3H is configured as a 3-input AND-gate. The resulting output signal 3H' is the 9-input AND-function of input signals F1–G4, H1, and F1–F4.

Similarly, as shown in FIG. 2B, a 9-input OR-gate can be implemented by configuring all the function generators F, G, 3H as OR-gates. The resulting output signal 3H' is the 9-input OR-function of input signals G1–G4, H1, and F1–F4.

Many other 9-input functions can be implemented in an XC4000-Series CLE. These wide logic functions are made possible only by the 3-input function generator 3H. Without the third function generator, the logic functions that can be implemented in a single CLE are much more limited. However, a 3-input function generator requires a great deal more silicon to implement than a more limited function such as, for example, a 2-to-1 multiplexer. Therefore, many CLEs do not include a third function generator as a supplement to a pair of 4-input function generators.

Function generator 3H can be replaced by a 2-to-1 multiplexer, with signal H1 selecting between output signals F' and F1. Replacing function generator 3H of FIG. 1 with a 2-to-1 multiplexer reduces the number of supported functions with up to nine input signals, but still provides any function of up to five input signals and reduces the silicon area required to implement a 5-input function generator. An FPGA using two 4-input function generators and a 2-to-1 multiplexer to implement a 5-input function generator is the XC3000™ family of products from Xilinx, Inc. The XC3000 CLE is described in pages 4–294 through 4–295 of the Xilinx September 1996 Data Book entitled "The Programmable Logic Data Book", available from Xilinx, Inc., which pages are incorporated herein by reference.

It would be advantageous to be able to implement certain wide logic gates using only two function generators. It is therefore desirable to provide structures and methods for implementing wide logic functions such as wide AND and OR-gates in a CLE while using only two function generators.

SUMMARY OF THE INVENTION

A first aspect of the invention provides a structure and method for implementing a wide AND-gate in an FPGA configurable logic element (CLE) or portion thereof that includes no more than two function generators. First and second function generators are configured as AND-gates. The output signals from the function generators (first and second AND signals) are combined in a 2-to-1 multiplexer controlled by the first AND signal. If all input signals to the first function generator are high, then the first AND signal is high, and the multiplexer passes the second AND signal. If at least one of the input signals to the first function generator is low, then the first AND signal is low, and the multiplexer passes the first AND signal, thereby providing a low multiplexer output signal. Therefore, a wide AND-gate is provided having a number of input signals equal to the total number of input signals for the two function generators.

Another embodiment of the invention provides a structure for generating other wide logic functions incorporating an AND function. For example, an OR-AND structure can be provided by configuring the first and second function generators as OR-gates, then using the 2-to-1 multiplexer (coupled as described above for the wide AND-gate) to AND together the output signals from the function generators.

A second aspect of the invention provides a structure and method for implementing a wide OR-gate in an FPGA CLE or portion thereof that includes no more than two function generators. First and second function generators are configured as OR-gates. The output signals from the function generators (first and second OR signals) are combined in a 2-to-1 multiplexer controlled by the second OR signal. If all input signals to the second function generator are low, then the second OR signal is low, and the multiplexer passes the first OR signal. If at least one of the input signals to the second function generator is high, then the second OR signal is high, and the multiplexer passes the second OR signal, thereby providing a high multiplexer output signal. Therefore, a wide OR-gate is provided having a number of input signals equal to the total number of input signals for the two function generators.

Another embodiment of the invention provides a structure for generating other wide logic functions incorporating an OR function. For example, an AND-OR structure can be provided by configuring the first and second function generators as AND-gates, then using the 2-to-1 multiplexer (coupled as described above for the wide OR-gate) to OR together the output signals from the function generators.

The invention allows the implementation of common wide logic functions in a single CLE. This efficient use of resources is advantageous. For example, two independent 8-input AND-gates can be implemented in a single CLE of a Virtex™ FPGA from Xilinx, Inc.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

Figure 1:
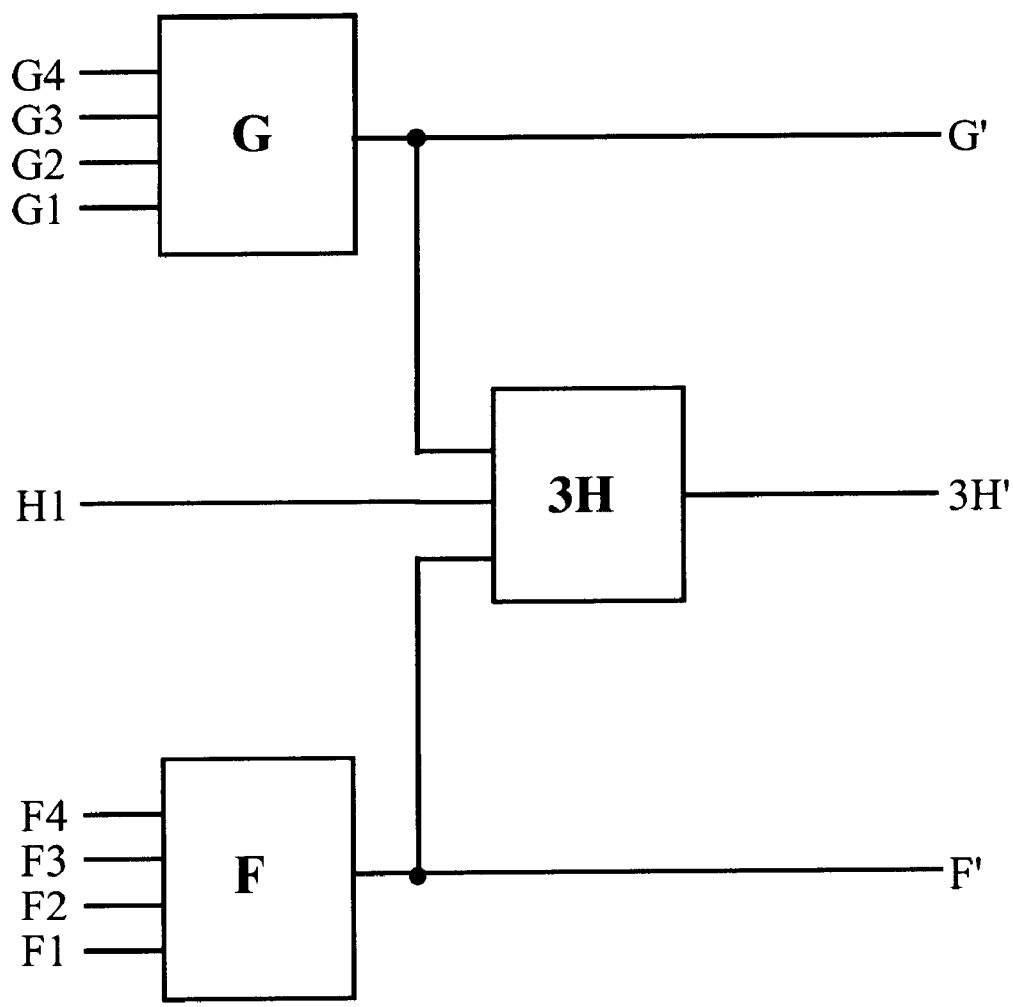
FIG. 1 shows a simplified diagram of a prior art XC4000-Series CLE.
Figure 2A:
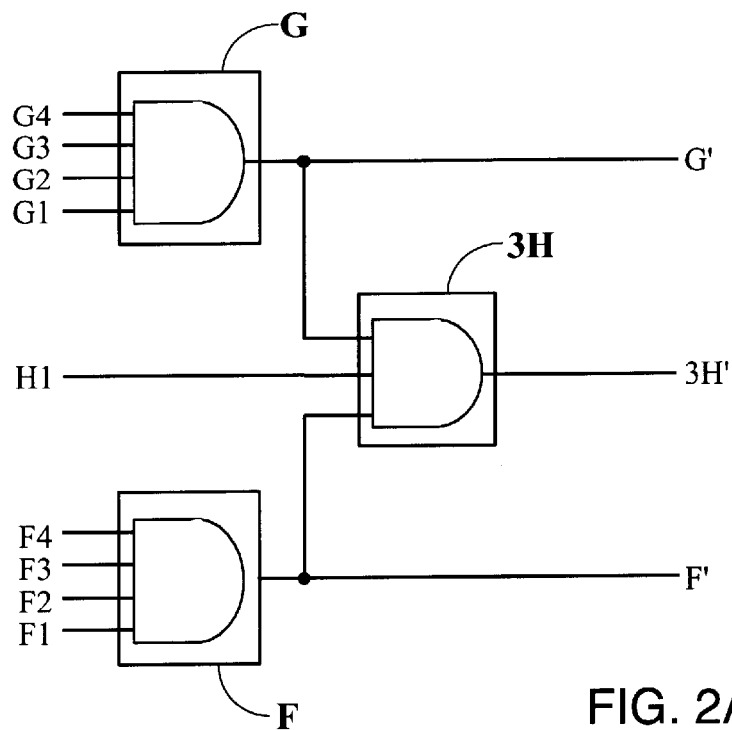
FIG. 2A shows a 9-input AND-gate implemented in an XC4000-Series CLE.
Figure 2B:
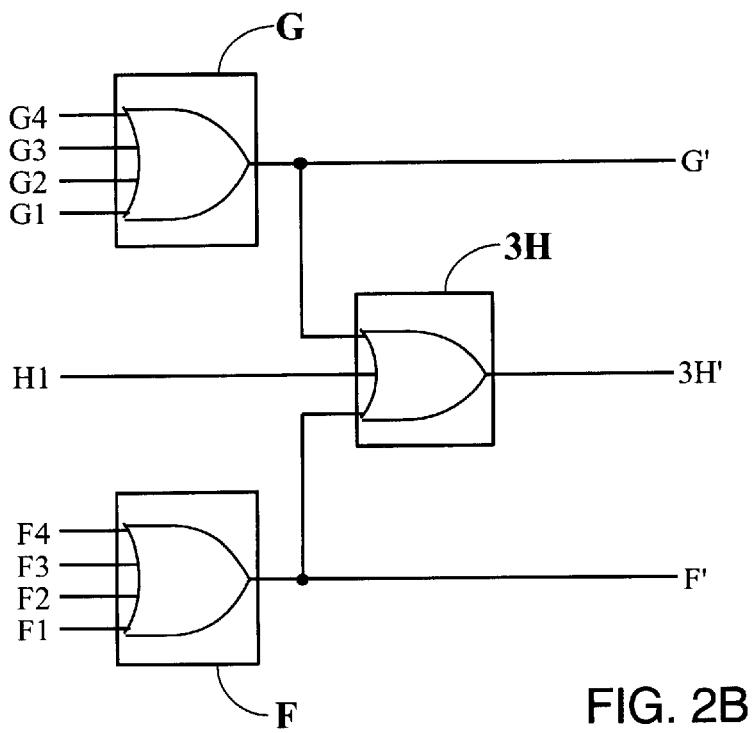
FIG. 2B shows a 9-input OR-gate implemented in an XC4000-Series CLE.
Figure 3:
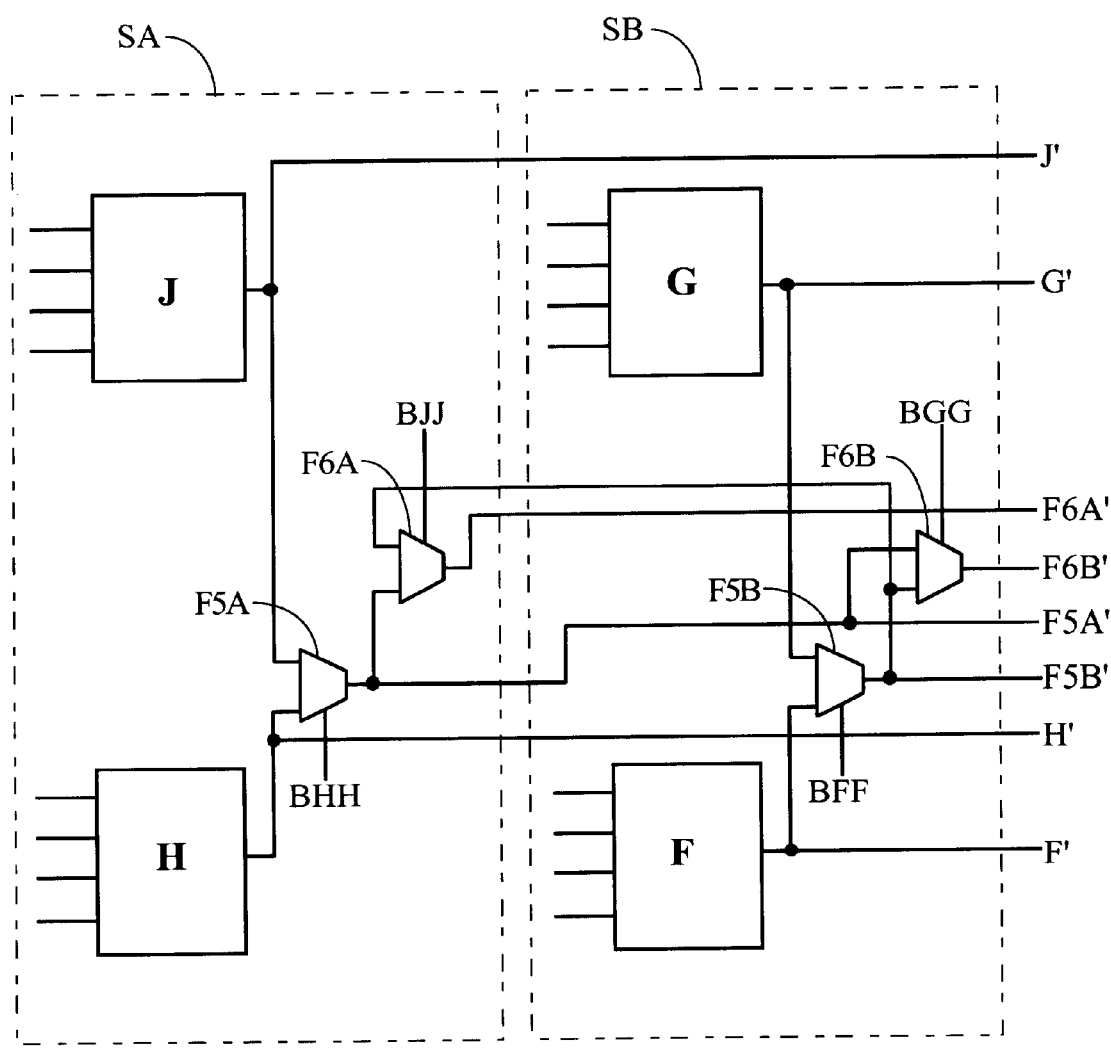
FIG. 3 shows a simplified diagram of a Virtex CLE.

Young et al, in U.S. Pat. Nos. 5,914,616 and 5,920,202 (referenced above), describe a Virtex FPGA wherein a Configurable Logic Element (CLE) is preferably included in each of an array of identical tiles. Young et al's CLE includes four 4-input function generators, as shown in FIG. 3. The output signals from first and second function generators J, H are combined with an independent input signal BHH in a five-input-function multiplexer F5A to produce an output signal F5A' that can be any function of five input signals. Additionally, multiplexer F5A can provide some functions of up to nine input signals, since none of the input signals are shared between the function generators J, H. The output signals from the third and fourth function generators G, F are similarly combined in five-input-function multiplexer F5B to generate an output signal F5B' that can also be any function of five input signals.

The output signals F5A', F5B' of the two five-input-function multiplexers F5A, F5B are then combined with a sixth independent input signal BJJ in a first six-input-function multiplexer F6A, and with a different sixth independent input signal BGG in a second six-input-function multiplexer F6B. The two six-input-function multiplexers F6A, F6B provide two output signals F6A', F6B', respectively. One of the output signals can be any function of six inputs; the other output signal can be a related function of six input signals, where five input signals and two five-input-function multiplexers are shared between the two 6-input functions. When the sixth input signal is also shared, the two 6-input functions are the same, and output signals F6A' and F6B' are the same.

Clearly, either of the six-input-function multiplexers F6A, F6B can be combined with the other elements of the CLE to provide either a 6-input AND-gate or a 6-input OR-gate. However, this obvious implementation uses all four of the function generators F, G, H, J, as well as both five-input-function multiplexers F5A, F5B and one of the six-input-function multiplexers F6A, F6B, while providing only a 6-input wide AND or OR-gate. It is desirable to provide an implementation that uses the CLE resources more efficiently.

The CLE of FIG. 3 can be viewed as two slices SA, SB. Each slice SA, SB comprises two 4-input function generators (H and J, F and G, respectively), one five-input-function multiplexer (F5A, F5B, respectively), and one six-input-function multiplexer (F6A, F6B, respectively). The two slices are symmetric, and in one embodiment are laid out as mirror images of each other. In one embodiment, the invention provides a structure for implementing an 8-input AND-gate in a single slice of a Virtex CLE, using only two 4-input function generators and one five-input-function multiplexer, as described below in connection with FIG. 4. A similar structure for implementing an 8-input OR-gate is also provided, as described in connection with FIG. 5. Because each of these circuits is implemented in only one slice of the CLE, any combination of two independent such functions can be implemented in a single CLE. Thus, the invention provides a 2-to-1 savings of resources over the implementation that uses the six-input-function multiplexer as described above, while accommodating (in this example) two additional input signals.

Figure 4:
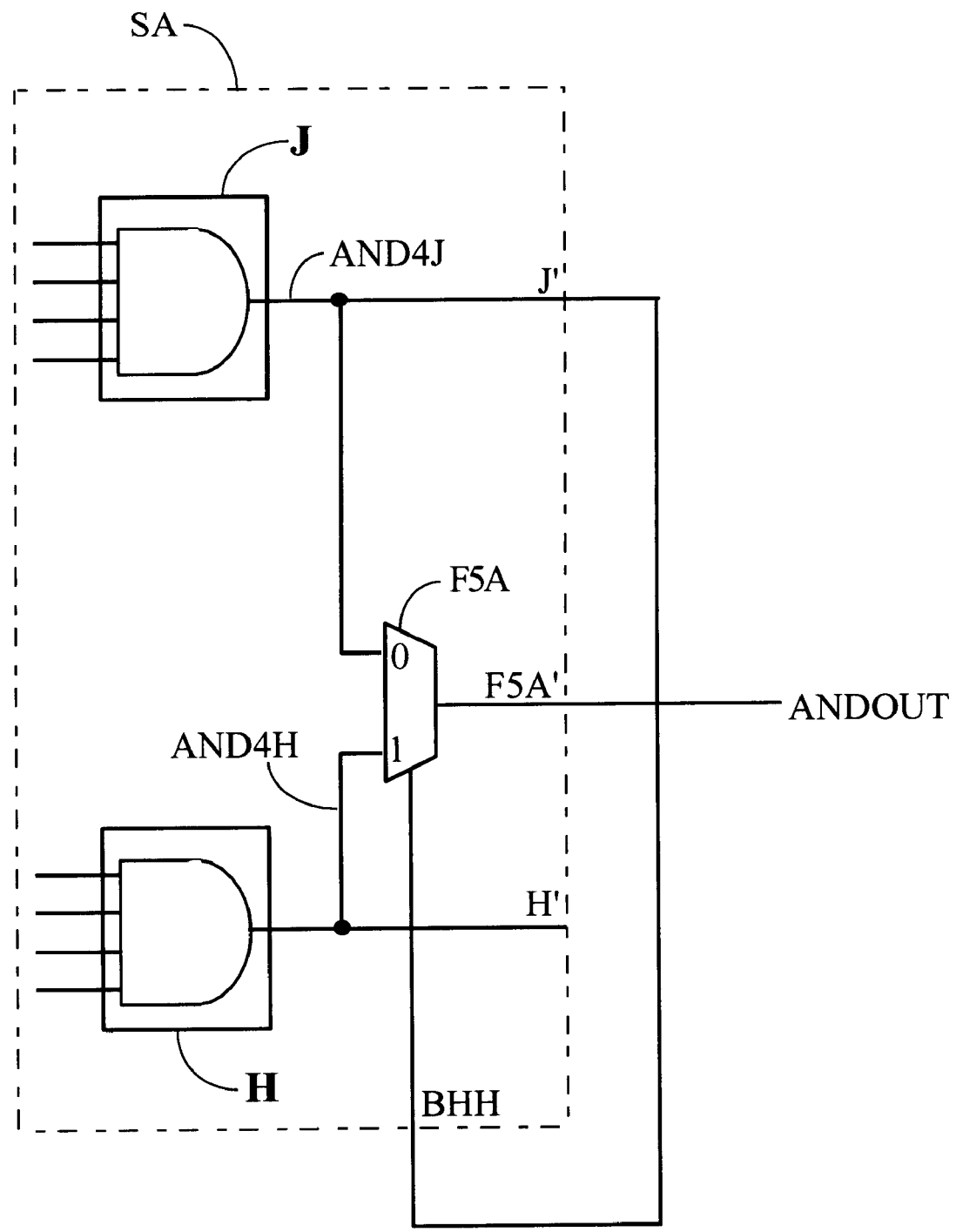
FIG. 4 shows an 8-input AND-gate implemented in one slice of a Virtex CLE.

FIG. 4 shows an 8-input AND-gate implemented in a single slice of a Virtex CLE according to one embodiment of the invention. In this embodiment, first and second function generators J, H are configured as 4-input AND-gates. The output signals from function generators J, H (AND signals AND4J, AND4H, respectively) are combined in a 2-to-1 multiplexer F5A controlled by AND signal AND4J. AND signal AND4J is passed by multiplexer F5A if the select signal (also AND4J) is low; while AND signal AND4H is passed if the select signal is high.

AND signal AND4J is preferably fed back from the CLE output terminal J' to the multiplexer select terminal BHH using the fastest available interconnect path. For example, AND signal AND4J can exit the CLE at terminal "V" in Young et al's FIG. 6A of U.S. Pat. No. 5,914,616, and re-enter the CLE at terminal "BH". In another embodiment, the AND signal AND4J is provided to the multiplexer select terminal BHH via a "fast feedback path", i.e., a high-speed path that bypasses the general interconnect lines, thereby further improving the performance of the wide logic function.

If all four input signals to function generator J are high, then AND signal AND4J is high, and multiplexer F5A passes AND signal AND4H to provide output signal AND-OUT. If at least one of the input signals to function generator J is low, then AND signal AND4J is low, and multiplexer F5A passes AND signal AND4J, thereby providing a low output signal ANDOUT. Therefore, an 8-input AND-gate is provided using only two function generators and only half of the Virtex CLE.

Note that although this embodiment is described in terms of a Virtex CLE, this embodiment can actually be implemented in any CLE having the elements and output terminals used in the embodiment of FIG. 4.

In another embodiment of the invention (not shown) other structures are provided for generating other wide logic functions incorporating an AND function. For example, an OR-AND structure can be provided by configuring function generators H and J as OR-gates, then using multiplexer F5A (coupled as shown in FIG. 4) to AND together the output signals from the function generators.

Figure 5:
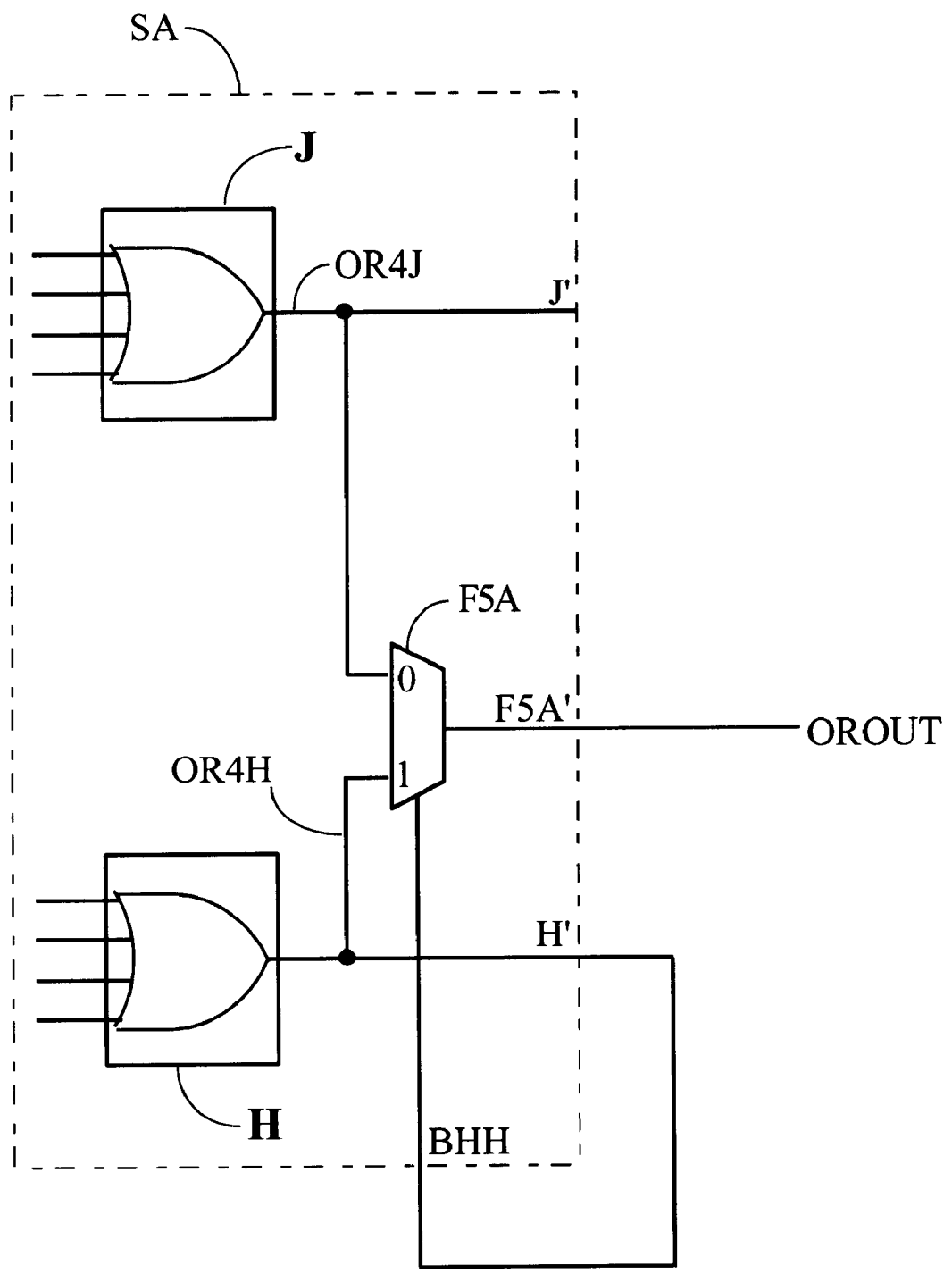
FIG. 5 shows an 8-input OR-gate implemented in one slice of a CLE similar to the Virtex CLE.

FIG. 5 shows an 8-input OR-gate implemented in a single slice of a CLE according to another embodiment of the invention. In this embodiment, first and second function generators J, H are configured as 4-input OR-gates. The output signals from function generators J, H (OR signals OR4J, OR4H, respectively) are combined in 2-to-1 multiplexer F5A controlled by OR signal OR4H. OR signal OR4J is passed by multiplexer F5A if the select signal (OR4H) is low; while OR signal OR4H is passed if the select signal is high.

OR signal OR4H is preferably fed back from the CLE output terminal H' to the multiplexer select terminal BHH using the fastest available interconnect path.

If all four input signals to function generator H are low, then OR signal OR4H is low, and multiplexer F5A passes OR signal OR4J to provide output signal OROUT. If at least one of the input signals to function generator H is high, then OR signal OR4H is high, and multiplexer F5A passes OR signal OR4H, thereby providing a high output signal OROUT. Therefore, an 8-input OR-gate is provided using only two function generators.

Note that the embodiment of FIG. 5 cannot be implemented exactly as shown in a Virtex CLE, because the second function generator and multiplexer output terminals H' and F5A' are shared: both signals exit the CLE on terminal "V" of the CLE, as shown in Young et al's FIG. 6A. However, this embodiment is applicable to a CLE wherein the two output terminals are not shared, and in particular to any CLE having the elements and output terminals used in the embodiment of FIG. 5. Further, a similar 8-input OR-gate can be implemented in a Virtex CLE simply by using the connection scheme shown in FIG. 4 (i.e., by coupling the output signal J' from the first function generator to the multiplexer select terminal), and inverting the sense of the select signal.

In another embodiment of the invention (not shown) other structures are provided for generating other wide logic functions incorporating an OR function. For example, an AND-OR structure can be provided by configuring function generators H and J as AND-gates, then using multiplexer F5A (coupled as shown in FIG. 5) to OR together the output signals from the function generators.

Clearly, in order to implement the invention, both the multiplexer output signal and at least one of the function generator output signals must have access to the interconnect structure (e.g., either a fast feedback path or the general interconnect) at the same time. Note that if the sense of the multiplexer select signal is programmable (i.e., programmably either a high or low select signal passes the output signal from the first function generator to the multiplexer output terminal) then either an AND or an OR-function can be implemented, even if only one of the function generator output signals has access to the interconnect structure at the same time as the multiplexer output signal.

Figure 6:
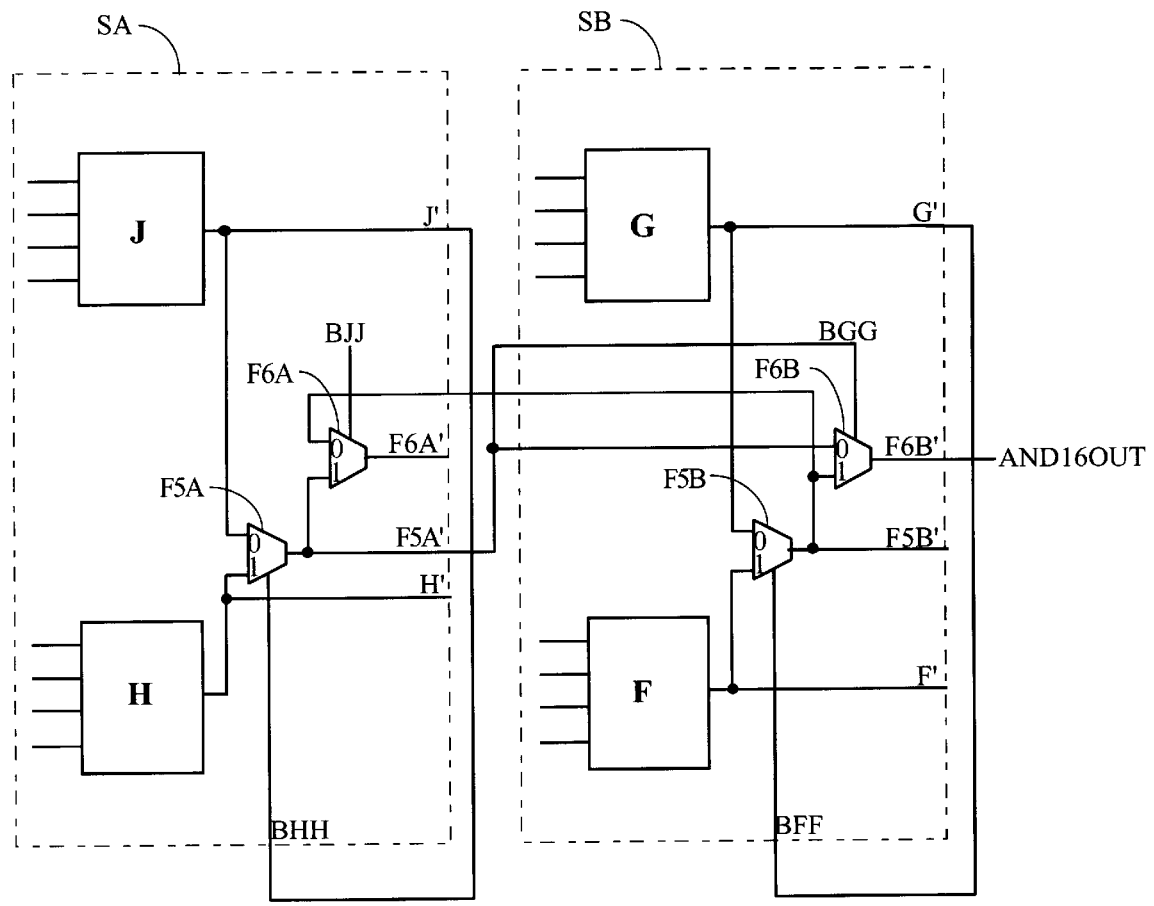
FIG. 6 shows a 16-input AND-gate implemented in two slices of a CLE similar to the Virtex CLE.

In another embodiment of the invention, each slice of a CLE is used to implement a wide function as previously described (e.g., each slice is used to implement an 8-input AND gate). The two 8-input signals are then combined in an additional 2-to-1 multiplexer to generate an even wider logic function (e.g., a 16-input AND gate). The additional multiplexer is controlled by a select signal provided by either of the two slices (e.g., by either of the two 8-input AND signals). According to this embodiment, a 16-input AND-gate is implemented as shown in FIG. 6. Note that in order to implement this embodiment one function generator output signal from each slice, plus three 2-to-1 multiplexer output signals, must have access to the interconnect structure at the same time.

In another embodiment, the F6A multiplexer is controlled as previously described to combine the signals generated by multiplexers F5A and F5B, where multiplexers F5A and F5B are conventionally used as simple multiplexers.

Using de Morgan's law, an OR-gate can be interpreted as a NAND-gate with inverted input signals, and an AND-gate can be interpreted as a NOR-gate with inverted input signals. Therefore, by using the function generators to provide inversion to the NAND or NOR function input signals, NAND and NOR-gates can also be implemented using the 2-to-1 multiplexer similar to the OR and AND-gates described above.

In one embodiment, not all of the function generator input terminals are used; for example, an AND-gate or OR-gate with less than eight input signals is generated from two 4-input function generators. In another embodiment, the two function generators have fewer or more than four input signals. In yet another embodiment, the two function generators have or are configured to have different numbers of input signals.

Those having skill in the relevant arts of the invention will now perceive various modifications and additions which may be made as a result of the disclosure herein of the preferred embodiment. For example, the above text describes the structures and methods of the invention in the context of the Virtex CLE from Xilinx, Inc. However, the invention can also be applied to other FPGAs and other programmable logic devices. Further, CLEs, function generators, and multiplexers other than those described herein can be used to implement the invention. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A multiplexer for implementing a logic function in a programmable logic device, the multiplexer comprising:
   a first input terminal;
   a second input terminal;
   a select terminal; and
   a line selectively coupling the select terminal to the first input terminal and further selectively coupling the select terminal to the second input terminal.

2. The multiplexer of claim 1, wherein the first input terminal is a "0" terminal and the second input terminal is a "1" terminal, and wherein if the multiplexer implements an AND gate, then the first input terminal is coupled to the select terminal via the line.

3. The multiplexer of claim 1, wherein if the first input terminal is coupled to the select terminal via the line, and
   if the first input terminal receives a logic one signal, and the multiplexer outputs a signal received on the second input terminal, and
   if the first input terminal receives a logic zero signal, and the multiplexer outputs the logic zero signal,
   then the multiplexer implements an AND function.

4. The multiplexer of claim 1, wherein if the first input terminal is coupled to the select terminal via the line, and
   if the first input terminal receives a first logic signal, and the multiplexer outputs a signal received on the second input terminal, and
   if the first input terminal receives a second logic signal opposite of the first logic signal, and the multiplexer outputs the second logic signal,
   then the multiplexer implements an AND function.

5. The multiplexer of claim 1, wherein the first input terminal is coupled to a first function generator.

6. The multiplexer of claim 5, wherein the second input terminal is coupled to a second function generator.

7. The multiplexer of claim 1, wherein the first input terminal is coupled to a first look-up table.

8. The multiplexer of claim 7, wherein the second input terminal is coupled to a second look-up table.

9. The multiplexer of claim 1, wherein the line is an interconnect line in the programmable logic device.

10. The multiplexer of claim 1, wherein the first input terminal is connected to a first means for implementing logic.

11. The multiplexer of claim 10, wherein the second input terminal is connected to a second means for implementing logic.

12. A multiplexer for implementing a logic function in a programmable logic device, the multiplexer comprising:
    a first input terminal;
    a second input terminal;
    a select terminal; and
    a line for selectively coupling the select terminal to one of the first input terminal and the second input terminal,
    wherein the first input terminal is a "0" terminal and the second input terminal is a "1" terminal, and wherein if the multiplexer implements an OR gate, then the second input terminal is coupled to the select terminal via the line.

13. A multiplexer for implementing a logic function in a programmable logic device, the multiplexer comprising:
    a first input terminal;
    a second input terminal;
    a select terminal; and
    a line for selectively coupling the select terminal to one of the first input terminal and the second input terminal,
    wherein if the second input terminal is coupled to the select terminal via the line, and
    if the second input terminal receives a logic one signal, and the multiplexer outputs the logic one signal, and
    if the second input terminal receives a logic zero signal, and the multiplexer outputs a signal received on the first input terminal,
    then the multiplexer implements an OR function.

14. A multiplexer for implementing a logic function in a programmable logic device, the multiplexer comprising:
    a first input terminal;
    a second input terminal;
    a select terminal; and
    a line for selectively coupling the select terminal to one of the first input terminal and the second input terminal,
    wherein if the second input terminal is coupled to the select terminal via the line, and
    if the second input terminal receives a first logic signal, and the multiplexer outputs the first logic signal, and
    if the second input terminal receives a second logic signal opposite that of the first logic signal, and the multiplexer outputs a signal received on the first input terminal,
    then the multiplexer implements an OR function.

15. A method of implementing a logic function in a programmable logic device using a multiplexer, the method including:
    providing the multiplexer comprising a first input terminal, a second input terminal, and a select terminal; and
    programmably selecting one of the first input terminal and the second input terminal and coupling the selected one of the first input terminal and the second input terminal to the select terminal.

16. The method of claim 15, wherein the multiplexer is configured to output a first signal received on the first input terminal if the select terminal receives a logic zero signal and to output a second signal received on the second input terminal if the select terminal receives a logic one signal.

17. The method of claim 16, wherein the multiplexer implements an AND function if the first input terminal is coupled to the select terminal.

18. A method of implementing a logic function in a programmable logic device using a multiplexer, the method including:
    providing the multiplexer comprising a first input terminal, a second input terminal, and a select terminal; and programmably selecting one of the first input terminal and the second input terminal and coupling the selected one of the first input terminal and the second input terminal to the select terminal, wherein the multiplexer is configured to output a first signal received on the first input terminal if the select terminal receives a logic zero signal and to output a second signal received on the second input terminal if the select terminal receives a logic one signal; and wherein the multiplexer implements an OR function if the second input terminal is coupled to the select terminal.

19. A method of implementing a logic function in a programmable logic device using a multiplexer, the method including:

providing the multiplexer comprising a first input terminal, a second input terminal, and a select terminal; and programmably selecting one of the first input terminal and the second input terminal and coupling the selected one of the first input terminal and the second input terminal to the select terminal, wherein the first input terminal receives a first output signal from a first AND function, the second input terminal receives a second output signal from a second AND function, and an output terminal of the multiplexer provides a wide AND function.

20. A method of implementing a logic function in a programmable logic device using a multiplexer, the method including:

providing the multiplexer comprising a first input terminal, a second input terminal, and a select terminal; and programmably selecting one of the first input terminal and the second input terminal and coupling the selected one of the first input terminal and the second input terminal to the select terminal, wherein the multiplexer is configured to output a first signal received on the first input terminal if the select terminal receives a logic zero signal and to output a second signal received on the second input terminal if the select terminal receives a logic one signal; and wherein the first input terminal receives a first output signal from a first AND function, the second input terminal receives a second output signal from a second AND function, and an output terminal of the multiplexer provides an AND-OR function.

21. A method of implementing a logic function in a programmable logic device using a multiplexer, the method including:

providing the multiplexer comprising a first input terminal, a second input terminal, and a select terminal; and programmably selecting one of the first input terminal and the second input terminal and coupling the selected one of the first input terminal and the second input terminal to the select terminal, wherein the multiplexer is configured to output a first signal received on the first input terminal if the select terminal receives a logic zero signal and to output a second signal received on the second input terminal if the select terminal receives a logic one signal; and wherein the first input terminal receives a first output signal from a first OR function, the second input terminal receives a second output signal from a second OR function, and an output terminal of the multiplexer provides a wide OR function.

22. A method of implementing a logic function in a programmable logic device using a multiplexer, the method including:

providing the multiplexer comprising a first input terminal, a second input terminal, and a select terminal; and programmable selecting one of the first input terminal and the second input terminal and coupling the selected one of the first input terminal and the second input terminal to the select terminal, wherein the first input terminal receives a first output signal from a first OR function, the second input terminal receives a second output signal from a second OR function, and an output terminal of the multiplexer provides an OR-AND function.

23. A method of implementing a logic function in a programmable logic device using a multiplexer having a first input terminal, a second input terminal, and a select terminal, the method comprising:

implementing a first logic function by programmably coupling the first input terminal to the select terminal; and implementing a second logic function by programmably coupling the second input terminal to the select terminal.

24. A method of providing multiple logic functions in a programmable logic device, the method comprising:

providing a multiplexer including a first input terminal, a second input terminal, and a select terminal, wherein a logic function is implemented by programmably coupling the select terminal to the first input terminal; and changing the logic function by programmable coupling the select terminal to the second input terminal.

25. The method of claim 24, wherein the programmable coupling is implemented by using an interconnect in the programmable logic device.

26. A logic element in a programmable logic device, the logic element comprising:

a first function generator having an output terminal;

a second function generator having an output terminal;

a multiplexer comprising:

a first input terminal coupled to the output terminal of the first function generator;

a second input terminal coupled to the output terminal of the second function generator; and a select terminal; and a line programmably coupling the select terminal of the multiplexer to the output terminal of the first function generator.

27. The logic element of claim 26, wherein the first input terminal is a "0" terminal and the second input terminal is a "1" terminal, and wherein if the multiplexer implements an AND gate, then the first input terminal is coupled to the select terminal via the line.

28. The logic element of claim 26, wherein the first input terminal is a "0" terminal and the second input terminal is a "1" terminal, and wherein if the multiplexer implements an OR gate, then the second input terminal is coupled to the select terminal via the line.

29. The logic element of claim 26, wherein if the first input terminal is coupled to the select terminal via the line, and if the first input terminal receives a logic one signal, and the multiplexer outputs a signal received on the second input terminal, and if the first input terminal receives a logic zero signal, and the multiplexer outputs the logic zero signal, then the multiplexer implements an AND function.

30. The logic element of claim 26, wherein if the second input terminal is coupled to the select terminal via the line, and if the second input terminal receives a logic one signal, and the multiplexer outputs the logic one signal, and if the second input terminal receives a logic zero signal, and the multiplexer outputs a signal received on the first input terminal, then the multiplexer implements an OR function.

31. The logic element of claim 26, wherein if the first input terminal is coupled to the select terminal via the line, and if the first input terminal receives a first logic signal, and the multiplexer outputs a signal received on the second input terminal, and if the first input terminal receives a second logic signal opposite of the first logic signal, and the multiplexer outputs the second logic signal, then the multiplexer implements an AND function.

32. The logic element of claim 26, wherein if the second input terminal is coupled to the select terminal via the line, and if the second input terminal receives a first logic signal, and the multiplexer outputs the first logic signal, and if the second input terminal receives a second logic signal opposite that of the first logic signal, and the multiplexer outputs a signal received on the first input terminal, then the multiplexer implements an OR function.

33. The logic element of claim 26, wherein the first function generator is a look-up table.

34. The logic element of claim 26, wherein the second function generator is a look-up table.

35. The logic element of claim 26, wherein the line is an interconnect line in the programmable logic device.

* * * * *